United States Patent [19]
Fukuda

[11] Patent Number: 5,483,495
[45] Date of Patent: Jan. 9, 1996

[54] SEMICONDUCTOR MEMORY DEVICE HAVING DUMMY DIGIT LINES

[75] Inventor: Takeshi Fukuda, Kanagawa, Japan

[73] Assignee: NEC Corporation, Tokyo, Japan

[21] Appl. No.: 285,291

[22] Filed: Aug. 3, 1994

[30] Foreign Application Priority Data

Aug. 3, 1993 [JP] Japan ................................ 5-191542

[51] Int. Cl.$^6$ ............................................ G11C 7/02
[52] U.S. Cl. .................................... 365/210; 365/63
[58] Field of Search ............................. 365/51, 63, 203, 365/206, 210

[56] References Cited

U.S. PATENT DOCUMENTS

| | | | |
|---|---|---|---|
| 4,491,858 | 1/1985 | Kawamoto | 365/210 X |
| 5,062,077 | 10/1991 | Takashima et al. | 365/210 X |

*Primary Examiner*—Joseph A. Popek
*Attorney, Agent, or Firm*—Sughrue, Mion, Zinn, Macpeak & Seas

[57] ABSTRACT

A semiconductor memory device as a video memory is disclosed. The video memory includes a first memory cell array plate having a plurality of first pairs of digit lines and a plurality of second pairs of digit lines, a plurality of first sense amplifiers arranged along one side of the first array plate and provided for the first pairs of digit lines, a plurality of second sense amplifiers arranged along an opposite side of the first array plate and provided for the second pairs of digit lines, a second memory cell array plate having a plurality of third pairs of digit lines, and a plurality of third sense amplifier provided for the third pairs of digit lines. A plurality of pairs of dummy digit lines are further provided in the second memory cell array plate so that the first and second cell array plates has the pairs of digit lines equal in number to each other.

7 Claims, 6 Drawing Sheets

SEMICONDUCTOR MEMORY DEVICE HAVING DUMMY DIGIT LINES

BACKGROUND OF THE INVENTION

1. Field of the Invention

The present invention relates to a semiconductor memory device and, more particularly, to a video memory device having a serial data transfer circuit for performing a serial data read/write operation.

2. Description of the Related Art

A semiconductor memory device comprises in general a memory cell array having a plurality of memory cells, an address buffer/decoder circuit for selecting one or more memory cells in response to address information and a data read/write circuit for reading or writing data form or into the selected memory cells. The application field of the memory device has been spread more and more. For example, such a memory device has been developed and put into practical use is a video signal processing field as a video memory (referred to as "VRAM" hereinafter). The VRAM includes, in addition to the circuit construction of a general purpose memory device, an auxiliary circuit for serially reading and writing data from and into the selected memory cells. The auxiliary circuit further has a function of transferring data between memory cells in the memory cell array.

Referring to FIG. 5, the VRAM according to the prior art includes two memory cell array portions 50 and 60 and an auxiliary circuit 1 provided therebetween. Each of the array portions 50 and 60 includes M word lines WL1 to WLm, N pairs of bit lines ($BLb_1$, $BLt_1$) to ($BLb_n$, $BLt_n$) and memory cells MC disposed at the intersections of the word and digit lines. Each of the memory cells MC is of the so-call one transistor DRAM cell and composed of one transistor and one capacitor. Further included in the each memory cell array portion are N sense amplifiers SA1 to SAn each coupled to an associated one of the digit line pairs and N precharging circuits PT precharging the associated bit line pair to a reference voltage on a line VH in response to a precharge signal PD. The reference voltage is designed to ½ Vcc.

The auxiliary circuit 1 includes a plurality of transfer gates SWL and SWH and plurality of data registers DR1 to DRn which are connected as shown. The transfer gates SWL are rendered conductive or nonconductive by a first control signal DTL, and the gates SWH are controlled by a second control signal DTH. Although not shown, the auxiliary circuit 1 further includes a shift register having a plurality of shift stages each coupled to an associated one of the data registers DR1 to perform a serial data transfer on each of the data registers DR1.

In the VRAM thus constructed, when the cell array portion 50 (or 60) is designated by a set of address signals (not shown), the control signal DTL (or DTH) is made active to render each of the transfer gates SWL (or SWH) conductive. In a data read operation, therefore, the data stored in the selected memory cells MC are temporarily latched in the data registers DR and then outputted to the external in series. In a data write operation, on the other hand, data to be written, which are inputted in seried from the external and latched in the data registers DR, are transferred and then stored in the selected memory cells MS. Moreover, the data stored in the memory cells MC in the portion 50 can be transferred to the selected memory cells MC in the portion 60 through the circuit 1 and vice versa.

In recent years, the miniaturization of the memory cell has been accelerated, so that the distance between the adjacent digit lines, i.e. the pitch of the digit lines is made small remarkably. On the other hand, each of the sense amplifiers SA and the data registers DR requires several transistors and thus occupies a relatively large area. For this reason, it is impossible for a VRAM having memory capacity larger than that of the VRAM shown in FIG. 5 to arrange all the required number of the sense amplifiers SA and the data registers DR in line along and between the cell array portions 50 and 60.

Therefore, a pair of sense amplifier and data register is required to be disposed in, for example, twice pitch of the disposing pitch of the digit line pair, as shown in FIG. 6. More specifically, on both sides of each of memory cell array portions or plates 3-2 and 3-3, there are provided auxiliary circuits 4-1 to 4-3 having a plurality of sense amplifiers SA are disposed in twice pitch of the digit line pair pitch. The respective ones of the adjacent pairs of digit lines 6 are connected to associated ones of the upper side sense amplifiers SA and the respective others thereof are connected to associated ones of the lower side sense amplifiers SA. Further provided in each auxiliary circuit 4 are data registers DA correspondingly to the sense amplifiers SA. In order to perform a data transfer among the memory cells disposed in difference memory plates, there are further provided two additional memory cell array plates 3-1 and 3-4, each of which has a plurality of digit line pairs 6 as well as a plurality of word lines and memory cells (not shown). It is to be noted that the number of the digit line pairs 6 provided in each of the cell array plates 3-1 and 3-4 is half of that of the digit line pairs 6 provided in each of the other cell array plates 3-2 and 3-3, because the cell array plates 3-1 and 3-4 belong only to the auxiliary circuits 4-1 and 4-3, respectively.

As is apparent from FIG. 6, consequently, the distance between the adjacent digit line pairs in each of the plates 3-1 and 3-4 is difference from that between the adjacent digit line pairs in each of the plates 3-2 and 3-3. In other words, the stray capacitances of the digit lines in the plates 3-1 and 3-4 are different from those of the digit lines in the plates 3-2 and 3-3. For this reason, it is unavoidable that the difference occurs between each of the plates 3-1 and 3-4 and each of the plates 3-2 and 3-3 in digit line precharging time period as well as data reading and writing time period. A mulfunction may occur accordingly.

SUMMARY OF THE INVENTION

It is therefore an object of the present invention to provide an improved memory device having an auxiliary circuit for a data transfer between different memory cell array plates. It is another object of the present invention to provide a VRAM in which stray capacitance of all digit line pairs are made substantially coincident with one another.

A semiconductor memory circuit according to this invention is characterized in that a plurality pairs of dummy digit lines are provided to the plates situated at the end portions among a large number of memory cell array plates, in order to make the number of digit lines in these portions to have the same number of digit lines as in the plates situated in portions other than those at the end portions.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
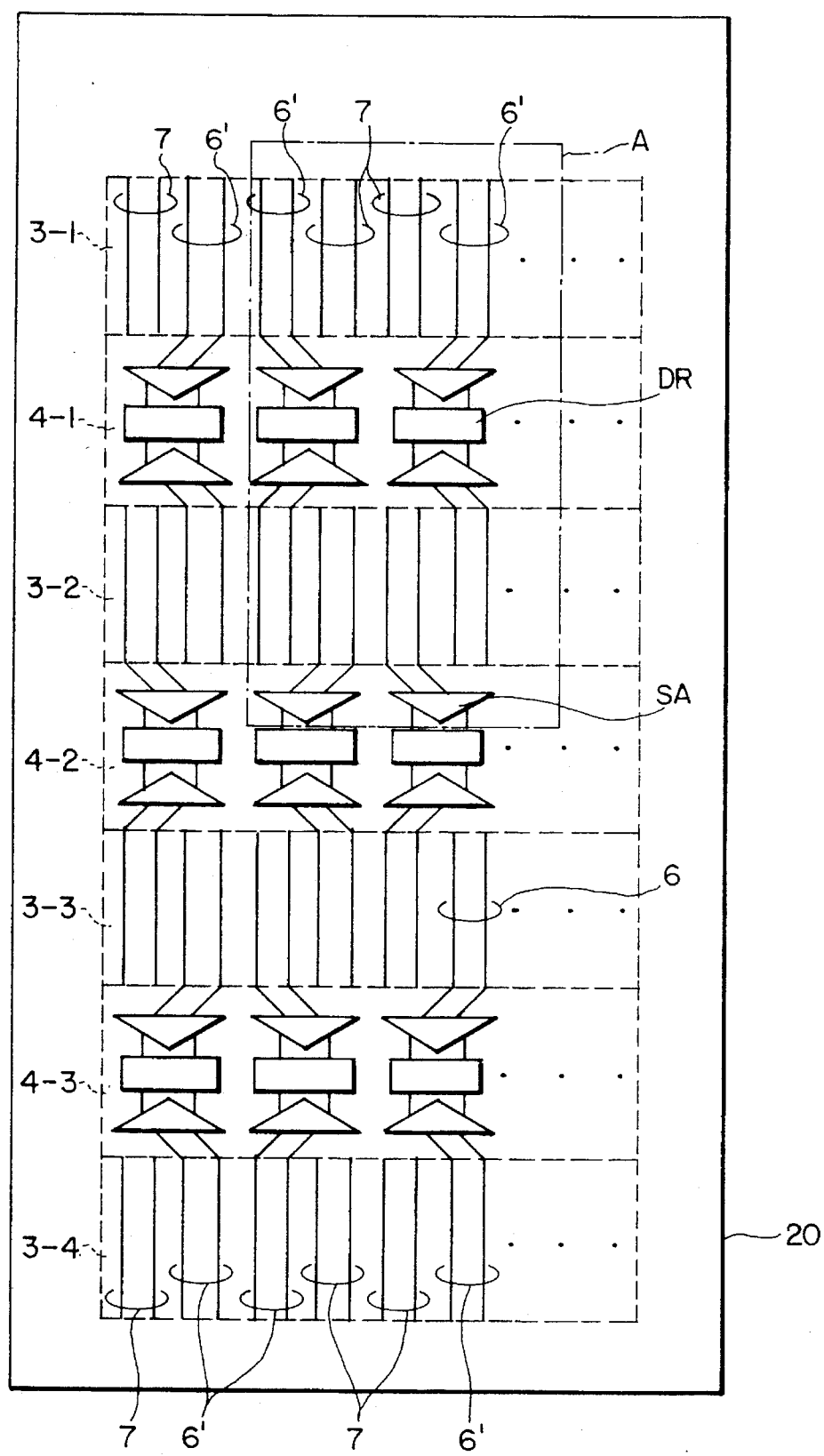
FIG. 1 is a schematic overall plan view of a semiconductor memory device according to an embodiment of this invention.
Figure 6:
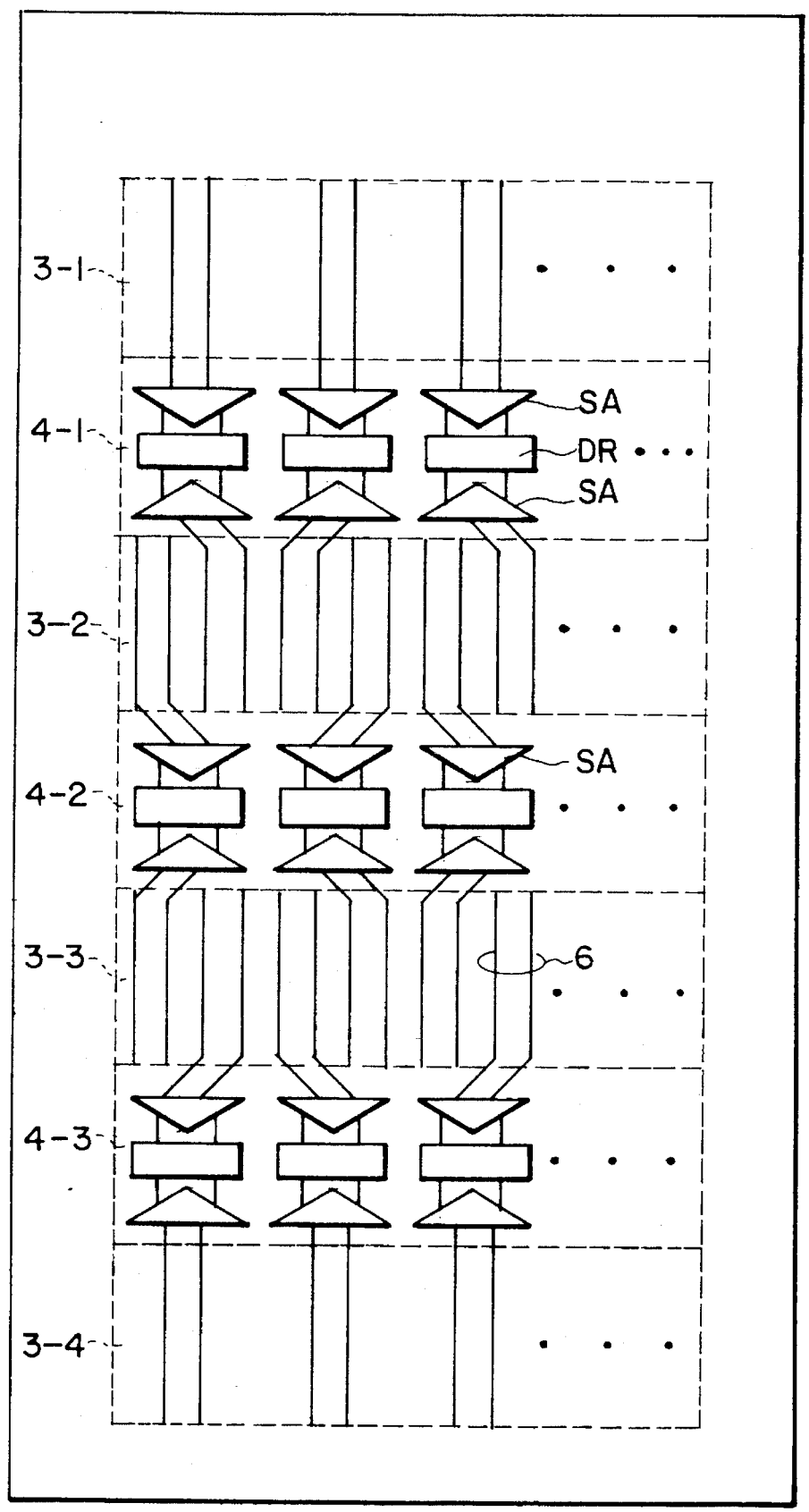
FIG. 6 is a schematic overall plan view showing the conventional semiconductor memory circuit.

Referring to FIG. 1, a VRAM 20 according to an embodiment of this invention includes four memory cell array plates 3-1 to 3-4 and three auxiliary circuits portions 4-1 to 4-3 which are disposed as shown in the figure, similarly to the VRAM 2 shown in FIG. 6. As is apparent from comparison between FIGS. 1 and 6, however, the VRAM 20 according to the present embodiment is different from the VRAM 2 in the following two points.

First, each of the digit line pairs in each of the cell plates 3-1 and 3-2 is shifted leftward or rightward as shown by the reference numeral 6' in FIG. 1 to be arranged in line with the corresponding digit line pair 6 of the cell plate 3-2 or 3-3. Secondly, there are provided dummy digit line pairs 7 in each of the cell plates 3-1 and 3-4. Each of the dummy digit line pairs 7 is arranged in line with the digit line pair 6 of the corresponding cell plate 3-2 or 3-3.

In the VRAM 20 thus constructed, therefore, all the cell plates 3-1 to 3-4 have equivalently the same digit line pairs in number as one other. Moreover, the distance between adjacent digit line pairs is also made equal to each other in all the cell plates 3-1 to 3-4. The stray capacitances of all the digit line pairs 6, 6' and 7 are thereby made substantially coincident with one another.

Figure 2:
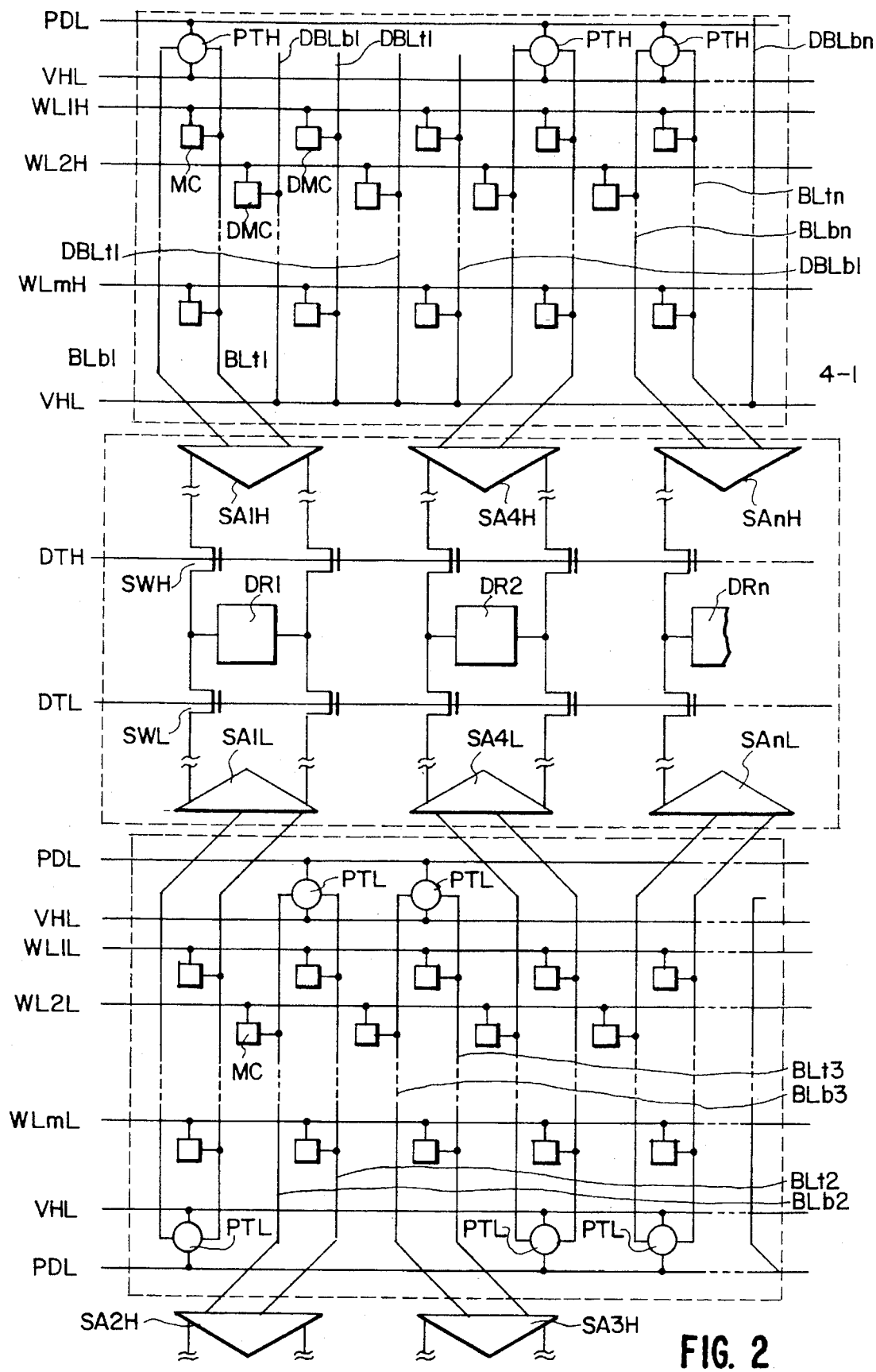
FIG. 2 is a circuit diagram showing one part surrounded by a one-dotted line A of the semiconductor memory device shown in FIG. 1.
Figure 5:
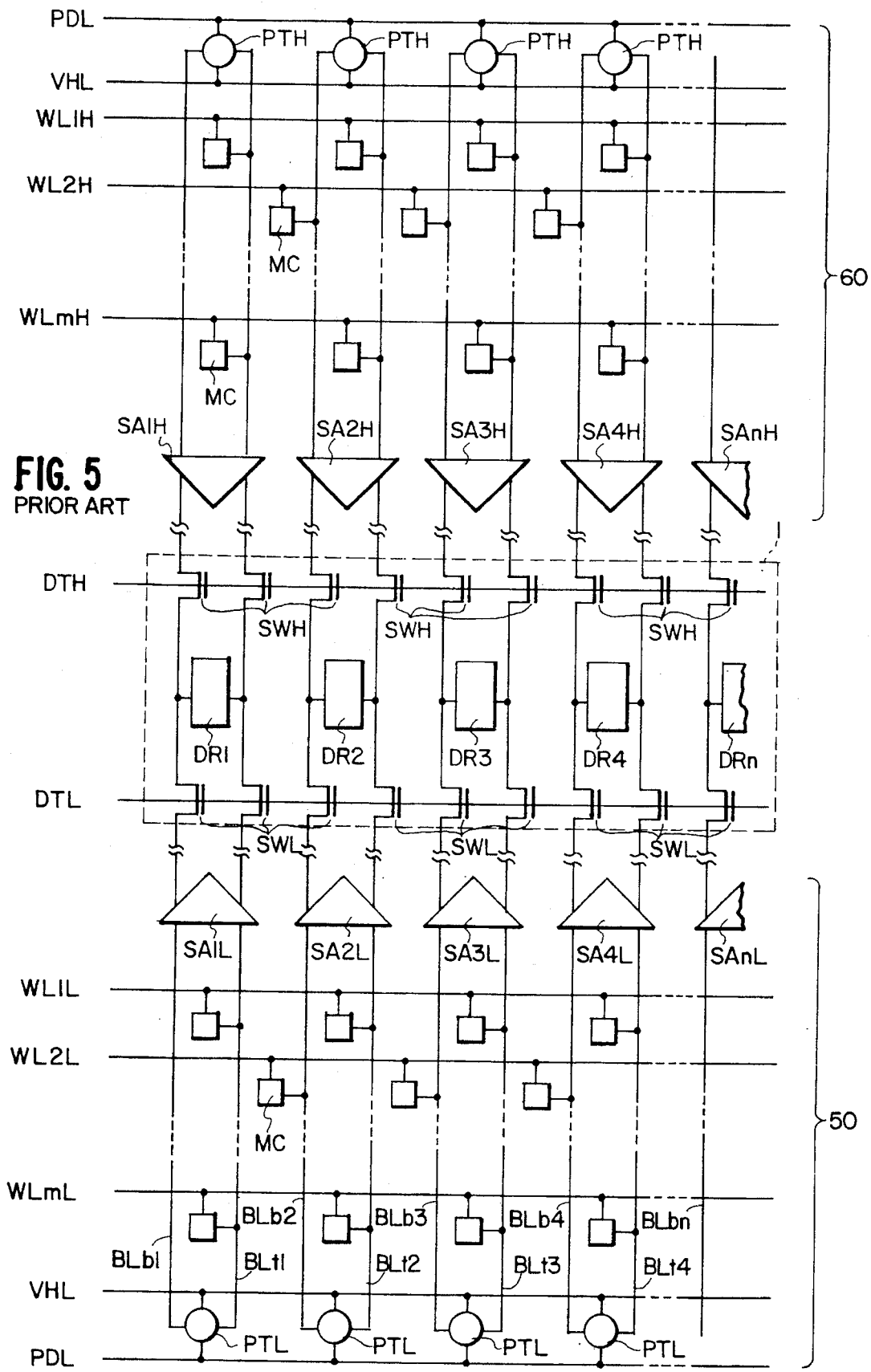
FIG. 5 is a circuit diagram showing a part of a specific circuit configuration of the conventional semiconductor memory circuit.

Referring to FIG. 2, each of the dummy digit line pairs 7 consists of true and complementary dummy digit lines DBLt and DBLb. Although each dummy digit line DBL is not related to the data read/write operation, in order to further symmetrize the circuit constructions among the cell plates 3-1 to 3-4 and thus further make the stray capacitances of each digit line pairs coincident with one another, a plurality of dummy memory cells, DMC are provided and disposed at the intersections of the word and dummy digit lines WL and DBL. Moreover, the precharging potential line VHL is connected in common to the dummy digit lines DBL to supply the reference level of Vcc/2 thereto. The remaining circuit construction is the substantially same as that shown in FIG. 5 and well known in the art, and hence the further description thereof will be omitted.

In transferring data in the memory cells MC to the data registers DR1 to DRn, the data are written to the data registers DR1 to DRn via the digit lines BLb1 to BLbn, and BLt to BLtn whose location in the upper or the lower side (H or L) is settled by means of the sense amplifiers SA1H to SAnH, through the operation of a data transfer switch SWH that is opened by a data transfer signal DTH.

In this case, the lower side circuit is closed by the signal line DTL of the data transfer switch SWL. On the contrary, when data are written to the data registers DR1 to DRn by the opening of the signal line DTL on the lower side, the signal line DTH is kept closed.

As described in the above, dummy digit lines are formed in this embodiment in the memory cell array plates situated at the end portions, the digit line pairs in the end portions are given the same structural conditions as those of the digit line pairs in the central portions, so that the interline capacity of the digit line pairs becomes everywhere the same even for a VRAM with large sized auxiliary circuits. Accordingly, malfunctions at reading or writing of data can be prevented. Moreover, in a memory device of the Vcc/2 precharging mode in which the digit line pairs are short-circuited in response to a precharging signal and precharged to Vcc/2 level, the potential of the dummy digit line pairs is fixed to Vcc/2 level in this embodiment. Therefore, the interline capacity between a dummy digit line pair and a nondummy digit line pair becomes substantially equal to the interline capacity between two regular digit line pairs, and almost all the digit line pairs come under nearly equal conditions so far as the interline capacity is concerned.

Figure 3:
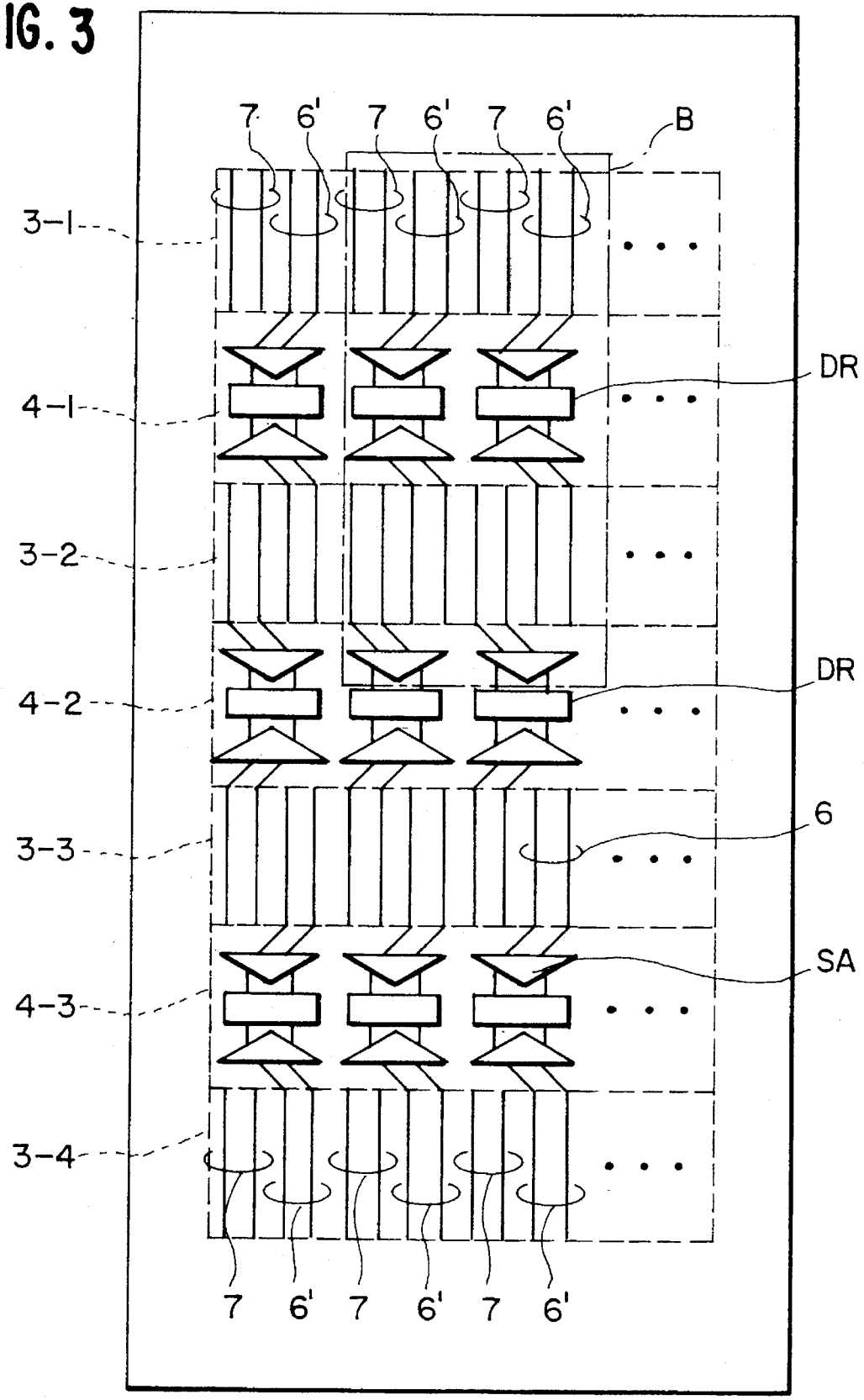
FIG. 3 is a schematic overall plan view of a semiconductor memory device according to another embodiment of the present invention.
Figure 4:
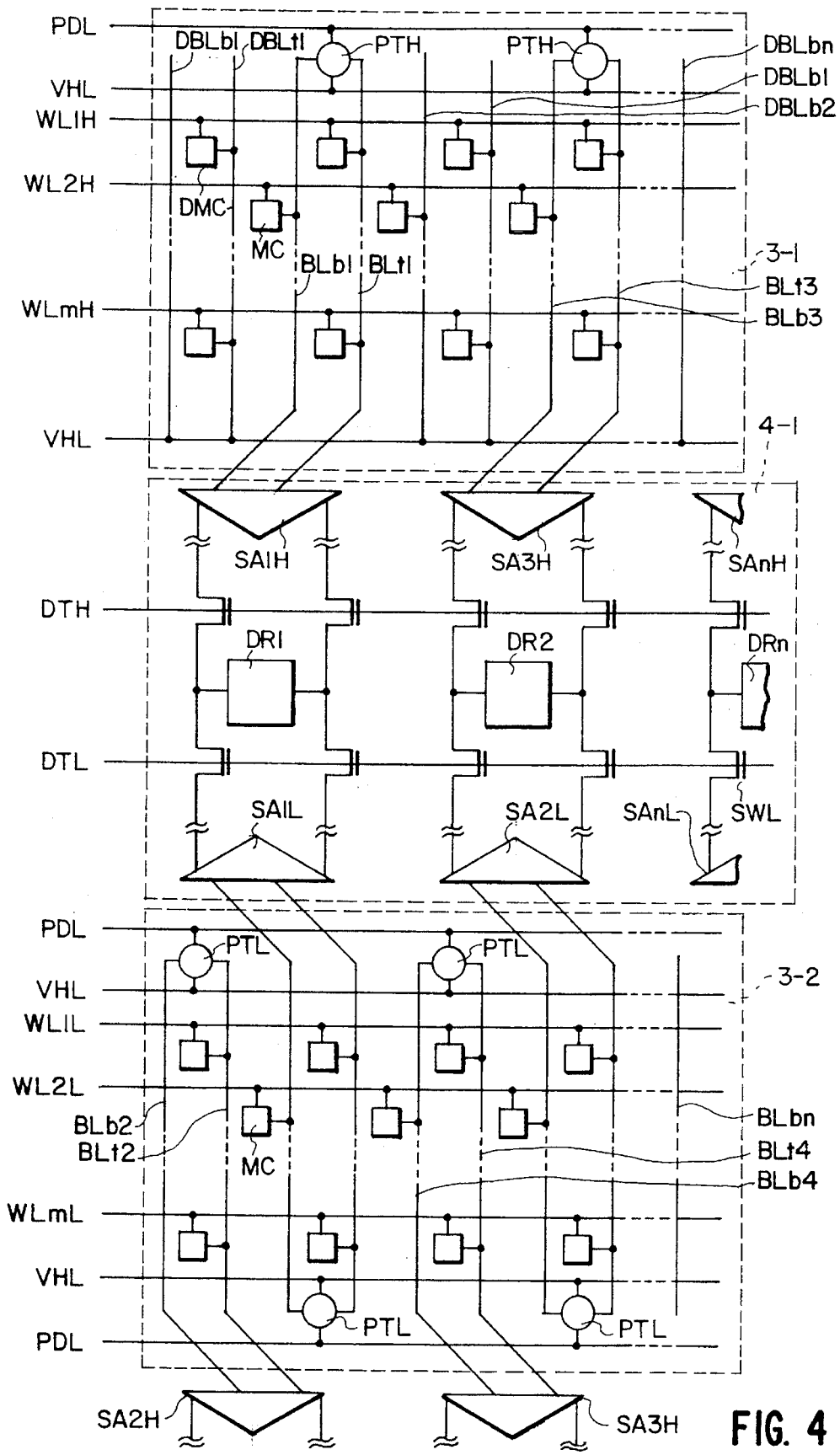
FIG. 4 is a circuit diagram showing one part surrounded by a one-dotted line B of the semiconductor memory device shown in FIG. 3.

Referring to FIGS. 3 and 4, there is shown a VRAM 201 according to another embodiment of the present invention, in which the same constituents as those shown in FIGS. 1 and 2 are denoted by the same reference numerals to omit the further description thereof. In the present VRAM 201, the odd-numbered digit line pairs 6 in each of the cell plates 3-2 and 3-3 are connected to the lower side sense amplifiers SA, respectively, and the even-numbered ones thereof are connected to the upper side sense amplifiers SA, respectively. Each of the digit line pairs 6 of each of the cell plates 3-1 and 3-4 are thereby shifted rightward to be arranged in line with corresponding even-numbered digit line pairs 6 of the cell plate 4-1 or 4-3. Moreover, each of the dummy digit line pairs 7 are disposed to be in line with the corresponding odd-numbered digit line pair.

Also in this embodiment, all the stray capacitances of the digit line pairs are made substantially equal to one another.

Although the invention has been described with reference to the above-embodiments, this description is not meant to be construed in a limiting sense. Various modifications of the disclosed embodiment, as well as other embodiments of the invention, will become apparent to persons skilled in the art upon reference to the description of the invention. It is therefore contemplated that the append claims will cover any modifications or embodiments as fall within the true scope of the invention.

What is claimed is:

1. A semiconductor memory device comprising first and second memory cell array plates and an auxiliary circuit portion disposed between said first and second memory cell array plates, said first memory cell array plate including a first number of digit line pairs and said second memory cell array plate including a second number of digit line pairs, said first number being larger than said second number, said auxiliary circuit portion including a plurality of first sense amplifiers for said digit line pairs of said first memory cell array plate and a plurality of second sense amplifiers for said digit line pairs of said second memory cell array plate, said second memory cell array plate further including a plurality of dummy digit line pairs, each of said dummy digit line pairs being isolated from any sense amplifiers.

2. The semiconductor memory device as claimed in claim 1, wherein each of said dummy digit line pairs, said first sense amplifiers and said second sense amplifiers are equal in number to said digit line pairs of said second memory cell array plate.

3. The semiconductor memory device as claimed in claim 1, wherein each of said digit line pairs is supplied with a reference potential in response to a precharging signal and each of said dummy digit lines is supplied constantly with said reference potential.

4. A semiconductor memory device comprising a first memory cell array plate including a plurality of pairs of first digit lines arranged in a first direction, a plurality of first sense amplifiers arranged in said first direction along one side of said first memory cell array plate, a plurality of second sense amplifiers arranged in said first direction along an opposite side of said first memory cell array plate, said pairs of first digit lines being divided in first and second groups, each of the pairs of first digit lines belonging to said first group being coupled to an associated one of said first sense amplifiers, each of the pairs of first digit lines belonging to said second group being coupled to an associated one of said second sense amplifiers, a second memory cell array plate including a plurality pairs of second digit lines arranged in said first direction, a plurality of third sense amplifiers arranged in said first direction between said second memory cell array plate and each of said first sense amplifiers and coupled to said pairs of second digit lines, respectively, a third memory cell array plate including a plurality of pairs of third digit lines arranged in said first direction, a plurality of fourth sense amplifiers arranged in said first direction between said third memory cell array plate and each of said second sense amplifiers and coupled to said pairs of third digit lines, respectively, each of said pairs of second digit lines being in line with a different one of said pairs of first digit lines belonging to said first group in a second direction perpendicular to said first direction, and a plurality of dummy digit lines provided in said second memory cell array plate, each of said pairs of dummy digit lines being in line with a different one of said pairs of first digit line in said second line.

5. The semiconductor memory device as claimed in claim 4, further comprising a plurality of data registers each coupled to an associated one of said first sense amplifiers and an associated one of said third sense amplifiers.

6. A semiconductor memory device comprising a first memory cell array plate including a plurality of pairs of first digit lines and a plurality of pairs of second digit lines, a second memory cell array plate including a plurality of pairs of third digit lines and a plurality of pairs of dummy digit lines, a plurality of first sense amplifiers provided between said first and second memory cell array plates and coupled respectively to said pairs of first digit lines in said first memory cell array plate, a plurality of second sense amplifiers provided between said first and second memory cell array plates and coupled respectively to said pairs of third digit lines in said second memory cell array plate, and a plurality of third sense amplifiers provided apart from said first and second sense amplifiers with and intervention of said first memory cell array plate therebetween and coupled respectively to said pairs of second digit lines in said first memory cell array plate, each of said pairs of dummy digit lines being in floating condition in isolation from any sense amplifier.

7. The semiconductor memory device as claimed in claim 6, where in said pairs of first, second, third and dummy digit lines are equal in number to one another.

* * * * *